(12) United States Patent  
Chen et al.

(10) Patent No.: US 7,345,503 B2  
(45) Date of Patent: Mar. 18, 2008

(54) METHOD AND APPARATUS FOR IMPEDANCE MATCHING IN TRANSMISSION CIRCUITS USING TANTALUM NITRIDE RESISTOR DEVICES

(75) Inventors: Fen Chen, Williston, VT (US); Kai D. Feng, Hopewell Junction, NY (US); Robert J. Gauthier, Jr., Hinesburg, VT (US); Tom C. Lee, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 11/427,798

(22) Filed: Jun. 30, 2006

(65) Prior Publication Data

US 2008/0001620 A1    Jan. 3, 2008

(51) Int. Cl.  
*H03K 17/16* (2006.01)  
*H03K 19/003* (2006.01)

(52) U.S. Cl. ....................................................... 326/30

(58) Field of Classification Search .................. 326/30, 326/83, 86  
See application file for complete search history.

(56) References Cited

U.S. PATENT DOCUMENTS 5,675,310 A    10/1997   Wojnarowski et al.

| | | | |
|---|---|---|---|
| 5,680,060 A * | 10/1997 | Banniza et al. | 326/30 |
| 6,586,964 B1 * | 7/2003 | Kent et al. | 326/30 |
| 6,597,198 B2 | 7/2003 | Haycock et al. | |
| 6,700,161 B2 | 3/2004 | Hsu et al. | |
| 6,836,170 B2 | 12/2004 | Kitagawa et al. | |
| 2005/0113034 A1 | 5/2005 | Mangino et al. | |

OTHER PUBLICATIONS

Tom Lee et al., "Characterization and Reliability of TaN Thin Film Resistors;" IEEE 42nd Annual International Reliability Physics Symposium, 2004, pp. 502-508.

* cited by examiner

*Primary Examiner*—Rexford Barnie  
*Assistant Examiner*—Crystal L Hammond  
(74) *Attorney, Agent, or Firm*—Cantor Colburn LLP; W. Riyon Harding

(57) ABSTRACT

A method for trimming impedance matching devices in high-speed circuits includes determining an electrical parameter associated with a first tantalum nitride (TaN) resistor used as an impedance matching device in the circuit under test, and comparing the determined electrical parameter associated with the first TaN resistor to a desired design value of the electrical parameter. The resistance value of the first TaN resistor is altered by application of a trimming voltage thereto, wherein the trimming voltage is based on a voltage-resistance characteristic curve of the first TaN resistor. It is then determined whether the altered resistance value of the first TaN resistor causes the electrical parameter to equal the desired design value thereof, and the altering of the resistance value of the first TaN resistor by application of a trimming voltage is repeated until the electrical parameter equals the desired design value thereof.

8 Claims, 5 Drawing Sheets

METHOD AND APPARATUS FOR IMPEDANCE MATCHING IN TRANSMISSION CIRCUITS USING TANTALUM NITRIDE RESISTOR DEVICES

BACKGROUND

The present invention relates generally to impedance matching techniques for integrated circuits and, more particularly, to a method and apparatus for impedance matching in transmission circuits using tantalum nitride based resistor devices.

It is well known that for high speed transmission circuits, the matching of input impedance, drive impedance, pull-up/pull-down resistance, and the like between circuits and components is an essential aspect of suppressing reflection of a transmitted signal so as to allow transmission of high quality high speed signals. However, the realities of the manufacturing processes of circuit components such as resistors, capacitors, and transistors are such that the resulting electrical parameters such as resistance and capacitance values can vary (for example) by about ±20% or more.

Accordingly, impedance trimming and matching networks are commonly used in conjunction with high speed transmission components in order to more precisely match, for example, input (transmission) circuit impedance to transmission line impedance. FIG. 1 is a schematic diagram of a conventional impedance matching circuit 100 utilizing switching "finger" resistors. As is shown, the circuit 100 includes three identical finger resistor networks: reference resistor network 102 and transmission resistor networks 104A, 104B. Resistor R0 is an external precision resistor representing the impedance to be matched by the transmission resistor networks associated with the transmission line.

Circuit 100 also includes a comparator 106, pulse generator 108, and an increment/decrement counter 110 forming a closed loop within a reference path in order to determine a specific combination of the finger resistors that are tuned "on" (i.e., connected) to the transmission line in order to match R0. In particular, resistor networks 102, 104A and 104B each include a plurality of individual resistors Rn1, Rn2, . . . , Rnn selectively coupled to a voltage supply bus (Vcc) through a series of corresponding PFET devices pn1, pn2, . . . , pnn. Control signals for each of the PFET devices are generated from the operation of the pulse generator 108 and increment/decrement counter 110.

In order to determine which combination of the finger resistor networks is activated (coupled to Vcc) so as to match R0, identical current sources I0, I1 are used to generate voltages at nodes Va, Vb, respectively. Thus, if the effective resistance of reference network 102 equals that of R0, the voltage at Va equals the voltage at Vb and no signal is output from comparator 106. In turn, pulse generator 108 and increment/decrement counter 110 do not change the state of any of the PFET devices in the finger networks 102, 104A, 104B. On the other hand, if the effective resistance of reference network 102 no longer equals that of R0, the voltage at Va will no longer equals the voltage at Vb and a, signal is output from comparator 106 (the polarity of which will depend on whether Va is greater or less than Vb. In turn, pulse generator 108 and increment/decrement counter 110 will operate to change the state of one or more of the PFET devices in the finger networks 102, 104A, 104B, thus dynamically adjusting the resistance thereof such that they are equal to R0.

Unfortunately, the finger resistor network scheme of circuit 100 has various disadvantages associated therewith. For instance, it is assumed that the resistance in each finger of reference network 102 is identical to that of networks 104A and 104B. However, in real devices, process variations can result in mismatches between the "identical" resistors/PFETs of the networks. Thus, even if the closed loop system of circuit 100 can match R0 to the resistance of reference 102, this is not a guarantee that the identical control configuration applied to the finger resistors of networks 104A and 104B will also be identical to R0.

Furthermore, the on-line switching of the resistor fingers generates voltage glitches on the (NFETs) N1A, N1B outputs, which can cause signal jitter in the transmission line. Another shortcoming of the circuit 100 is that the parasitic capacitance is large. Although, the "turned off" fingers provide no contribution to the total resistance of networks 104A and 104B, the parasitic capacitance of all the fingers is continuously coupled to the output nodes of N1A and N1B. Moreover, conventionally formed resistors, such as BR and OP (define) resistors, are physically located close to the device substrate, thus their parasitic capacitance is relatively large. As is well known, parasitic capacitance affects impedance matching, especially for high-speed applications.

SUMMARY

The foregoing discussed drawbacks and deficiencies of the prior art are overcome or alleviated by a method for trimming impedance matching devices in high-speed circuits. In an exemplary embodiment, the method includes determining an electrical parameter associated with a first tantalum nitride (TaN) resistor used as an impedance matching device in the circuit under test, and comparing the determined electrical parameter associated with the first TaN resistor to a desired design value of the electrical parameter. The resistance value of the first TaN resistor is altered by application of a trimming voltage thereto, wherein the trimming voltage is based on a voltage-resistance characteristic curve of the first TaN resistor. It is then determined whether the altered resistance value of the first TaN resistor causes the electrical parameter to equal the desired design value thereof, and the altering of the resistance value of the first TaN resistor by application of a trimming voltage is repeated until the electrical parameter equals the desired design value thereof.

In another embodiment, a high-speed transmission circuit includes a pair of tantalum nitride (TaN) resistors configured as impedance matching devices in opposing legs of a differential driver device formed on a chip. The pair of TaN resistors are configured so as to have an alterable resistance value thereof upon application of a trimming voltage thereacross, the trimming voltage based on a voltage-resistance characteristic curve of the TaN resistors. The trimming voltage used for altering the resistance of the first and second TaN resistors exceeds a designed operational voltage thereacross, and the pair of TaN resistors are configured to receive said trimming voltage applied thereto through an external testing device with respect to the chip.

TECHNICAL EFFECTS

As a result of the summarized invention, a solution is technically achieved in which tantalum nitride based resistors are calibrated and utilized in high-speed circuit applications that overcomes problems of process variation and parasitic capacitance.

BRIEF DESCRIPTION OF THE DRAWINGS

Referring to the exemplary drawings wherein like elements are numbered alike in the several Figures.

DETAILED DESCRIPTION

Figure 2:
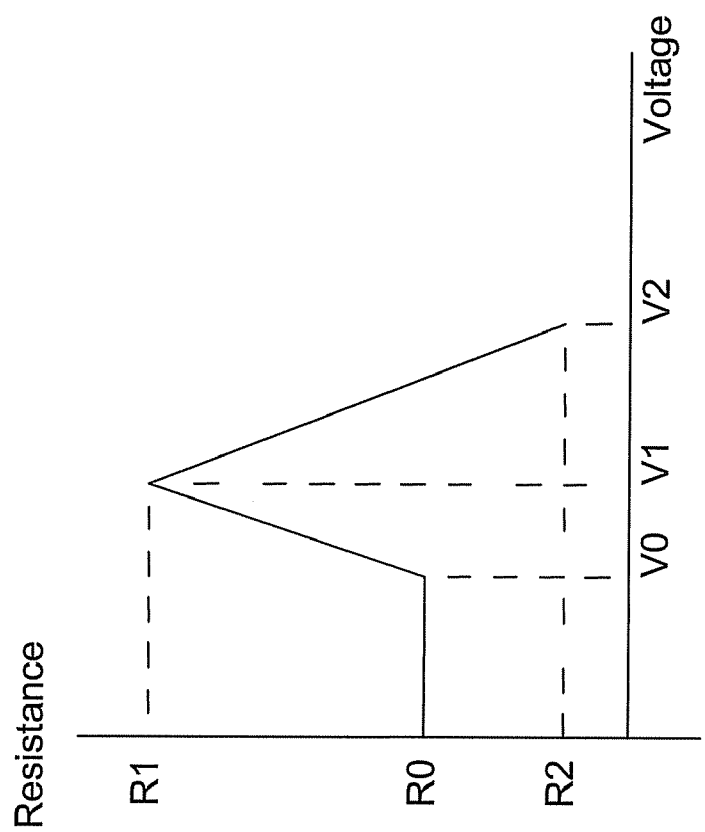
FIG. 2 is an exemplary voltage-resistance curve of a TaN resistor, utilized in accordance with an embodiment of the invention.

Disclosed herein is a method and apparatus for impedance matching in transmission circuits, using tantalum nitride (TaN) based resistor devices in lieu of finger resistance networks. A useful property of a TaN based resistor is that its resistance may be subsequently modulated by an applied voltage after the initial fabrication thereof, wherein the modified resistance value depends on the highest ramped voltage or the highest pulsed voltage used during tuning of the TaN resistor. Referring now to FIG. 2, an exemplary voltage-resistance curve of a TaN resistor is illustrated.

As is shown, when the highest applied voltage to the resistor is less than or equal to V0, the value of the resistance is maintained at the constant value of R0. However, when the highest applied voltage is between V0 and V1 (V1>V0), the value of the resistance increases to a corresponding value between R0 and R1 (with R1 representing a peak possible resistance value). If the highest applied voltage to the resistor then exceeds V1 (the voltage level at which the resistance value can be changed to a peak value), the value of the TaN resistance then decreases to a corresponding value between R1 and R2. Notably, the final resistance value (e.g., such as R2 cause by application of a voltage at value V2) can be lower than the initially manufactured value R0.

It should again be pointed out that since the resistance value of the TaN resistor corresponds to the highest applied voltage, there is no hysteresis effect. In other words, once V2 has been applied to the resistor, the resistance value of the resistor cannot be subsequently increased by applying V1, since V1 is less than V2 and would not be a peak value of voltage applied to the resistor. On the other hand, because the device resistance (corresponding to the highest applied voltage) is maintained even if the voltage is removed, the resistance of a TaN resistor is electrically programmable and electrically stable after programming. Still further benefits of utilizing TaN impedance matching devices in high-speed applications are that they have a low temperature coefficient, and have low parasitic capacitance associated therewith.

Figure 3:
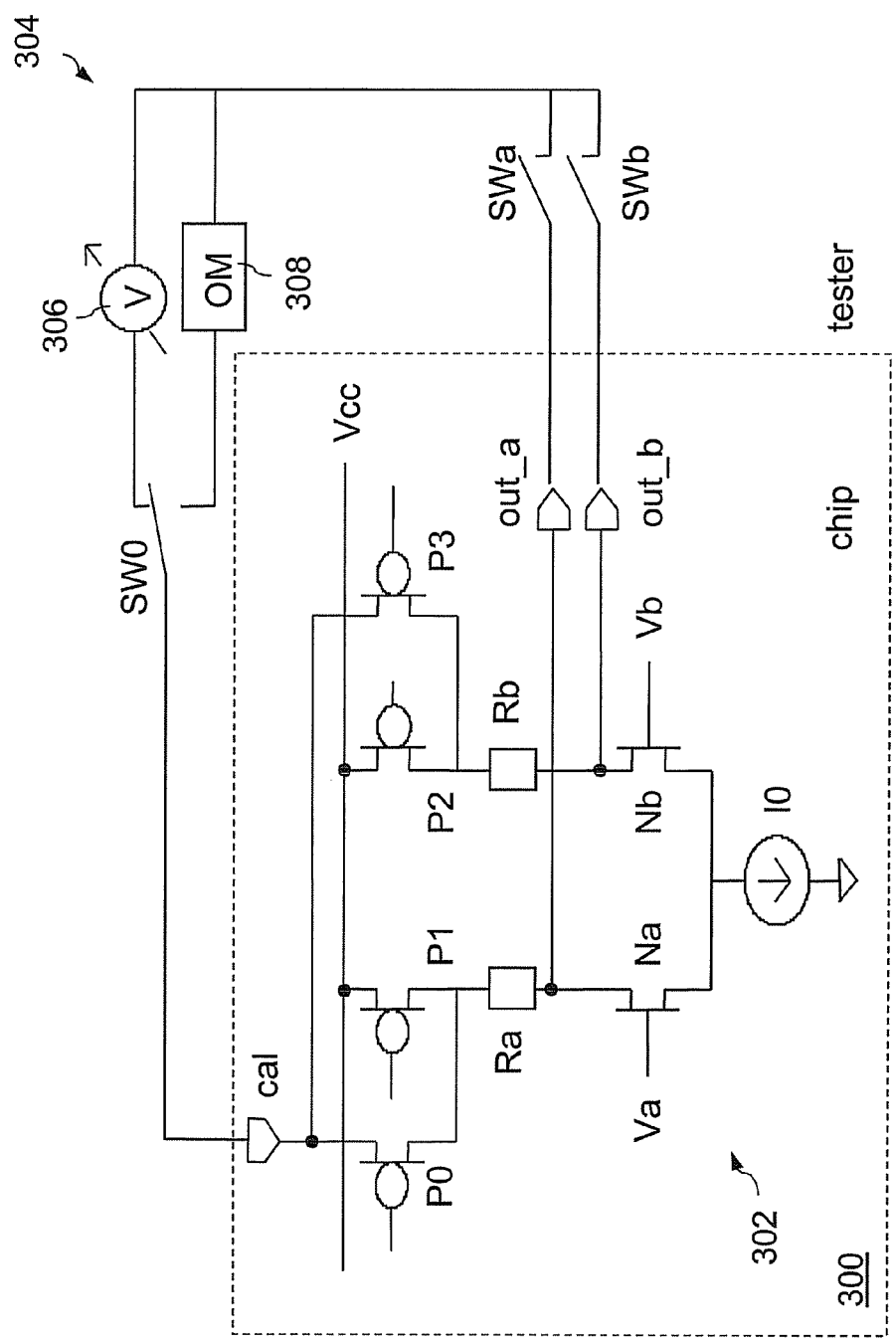
FIG. 3 is a schematic diagram of an apparatus and method for impedance matching in transmission circuits using TaN based resistors, in accordance with an embodiment of the invention.

Referring now to FIG. 3, there is shown a schematic diagram of an apparatus and method for impedance matching in transmission circuits using TaN based resistors, in accordance with an embodiment of the invention. In the embodiment depicted, a chip 300 has a differential driver circuit 302 formed thereon, which includes TaN impedance matching resistors Ra and Rb. Na and Nb are two identical NFETs, which form the driver differential pair, and I0 is the tail current source of the driver. As Ra, Rb are TaN resistors for the driver load (and are also the impedance matching devices), their resistance values should be as close to the transmission characteristic impedance Z0 as possible.

The voltage drop across the resistors in normal operation of the driver is about (0.75)(Z0)(I0), given the input impedance of the receiver (2×Z0). However, for overshoot/tolerance purposes, the maximum voltage across Ra and Rb is considered to be (Z0)(I0). Thus, if the expected or designed voltage to be applied across the TaN resistor (for a resistance of Z0) is be higher than (Z0)(I0), then the actual voltage drop across Ra and Rb during normal circuit operation should never change the resistance values of Ra or Rb. Stated another way, the value of V0 in FIG. 2 for a given TaN resistor (above which the resistance value may be changed) should be such that the actual operating voltages across the resistors are always less than V0 once the resistors are tuned.

Figure 1:
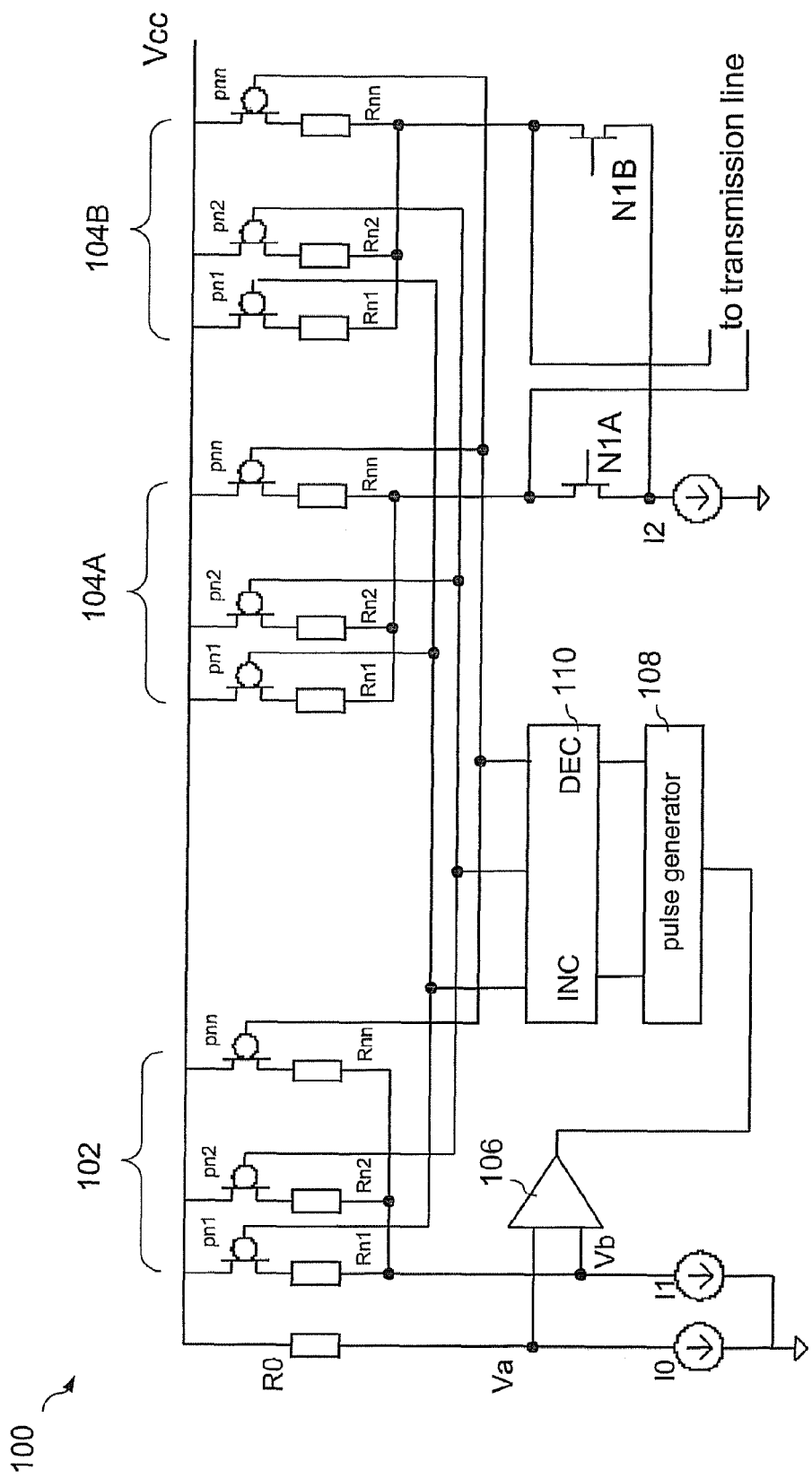
FIG. 1 is a schematic diagram of a conventional impedance matching circuit utilizing switching "finger" resistors.

Referring still to FIG. 3, P0, P1, P2 and P3 are four identical PFETs that are used to selectively couple the resistors Ra, Rb to one of a normal supply bus (Vcc) or a test calibration pin (cal) as described below. PFETs P0, P1, P2 and P3 are sized large enough so that the "on" (conducting) resistance is much smaller than Z0 and the parasitic capacitance can be ignored due to the small resistance connection to Vcc. As will be noted, the impedance matching resistors Ra, Rb, comprising single component TaN resistor are simpler in design than the finger networks 104A, 104B of FIG. 1, and do not have the large parasitic capacitances associated therewith, and may be individually tuned to overcome any process variations resulting from manufacturing. As further shown in FIG. 3, a voltage-based calibration tester 304 is connected to the chip 300 in order to tune Ra and Rb to the desired matched value. In particular, the tester 304 includes a variable voltage source 306 (capable of providing finely granular, step voltage signals), an ohmmeter (OM) 308 for resistance measurement, and (low on-resistance, high off-resistance) switches SW0, SW_a and SW_b.

In a calibration mode of resistance tuning, PFETs P1 and P2 are rendered non-conductive to isolate Ra and Rb from the Vcc bus, while differential driver NFETs Na and Nb are also switched off. The desired values of impedance matching resistors Ra and Rb are then individually tuned through the use of the external calibration tester 304.

For example, to tune the value of Ra, PFET P0 is activated to couple one end of Ra to the chip calibration pin (cal). In addition, switch SWa (coupled to output pin out_a on the other end of Ra) is closed. However, resistor Rb is still isolated from the tester 304 (i.e., P3 is "off" and SWb is open). SW0 may either be initially connected to the voltage source 306 or the ohmmeter 308. In the former instance, the set value of the voltage of the source 306 is applied across Ra; in the latter instance, the ohmmeter is configured to measure the value of Ra at that point.

If the actual measured resistance value of Ra is not equal to the desired design value of Ra, then the resistance of TaN resistor Ra can be tuned by selecting a suitable voltage to be applied by source 306 (according to an established curve such as shown in FIG. 2) that will either increase or decrease the resistance value as needed. Again, any such voltages applied by source 306 would, at that time, represent the highest applied voltage across Ra, which would then dictate the new resistance value. Thus, the voltage(s) applied across Ra in actual operation of the driver circuit 302 should be lower than any voltage applied by source 306 so that the normal operation of the device will not change the resistance of Ra. For purposes of clarity, a voltage applied to a TaN resistor for the purpose of altering its resistance value may be referred to as a "trimming voltage," so as to be distinguished from an "operating" voltage that would be applied across the resistor during normal circuit operation. Naturally, any operating voltages across the resistor should not be of a sufficient level to change the resistance thereof.

The alternating processes of resistance measurement of Ra and applied voltage to Ra may be repeated as needed until the resistance of Ra finally reaches the design target value of Z0. The procedure for calibration of TaN resistor Rb calibration is similar to that for Ra, but with switch SW_b closed, SW_a opened, PFET P0 off and PFET P3 conductive.

Figure 4:
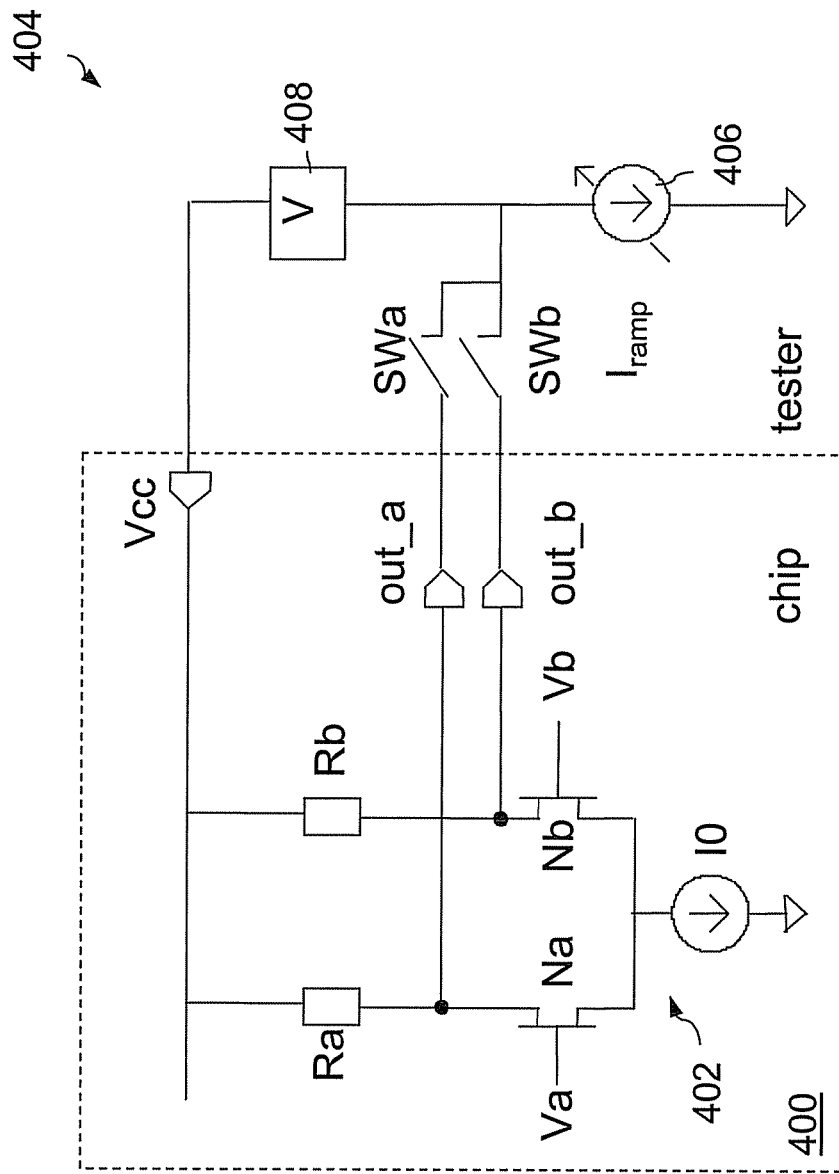
FIG. 4 is a schematic diagram of an apparatus and method for impedance matching in transmission circuits using TaN based resistors, in accordance with an alternative embodiment of the invention.

Referring now to FIG. 4, there is shown a schematic diagram of an apparatus and method for impedance matching in transmission circuits using TaN based resistors, in accordance with an alternative embodiment of the invention. Although the principle of tuning a TaN resistor is similar in this embodiment, the use of a variable current source and voltage measuring device in the tester (as opposed to a variable voltage source and resistance measuring device) allows for simplification of the control circuitry. As is particularly shown in FIG. 4, the differential driver circuit 402 formed on chip 400 is simpler than that of FIG. 3, in that no switching PFETs are used to selectively couple/decouple Ra and Rb to the Vcc bus and a separate calibration pin. Rather, the Vcc bus in the embodiment of FIG. 4 is directly accessible by the tester 404, which includes an adjustable current source 406 and voltmeter 408.

The tuning principle for the TaN resistors Ra, Rb in FIG. 4 is similar to that shown in FIG. 3, in that the resistance values are changed by a voltage applied across each that is of a value designed to increase/or decrease the value, based on a characteristic curve such as shown in FIG. 2. However, instead of directly applying a voltage and then subsequently measuring a resistance (and vice versa), the tester 404 of FIG. 4 is used to supply a current through a loop that includes the tuned resistor, which in turn results in a voltage thereacross. The greater the value of the input current from source 406, the higher the magnitude of the applied voltage to the resistor. Based on the input value of the current source 406, and the measured voltage value across the resistor being tuned, the resistance of Ra (or Rb) is determined. From a control signal standpoint, to calibrate Ra, only SWa need be closed while SWb is kept open. To calibrate Rb, SWb is closed while SWa is opened.

Figure 5:
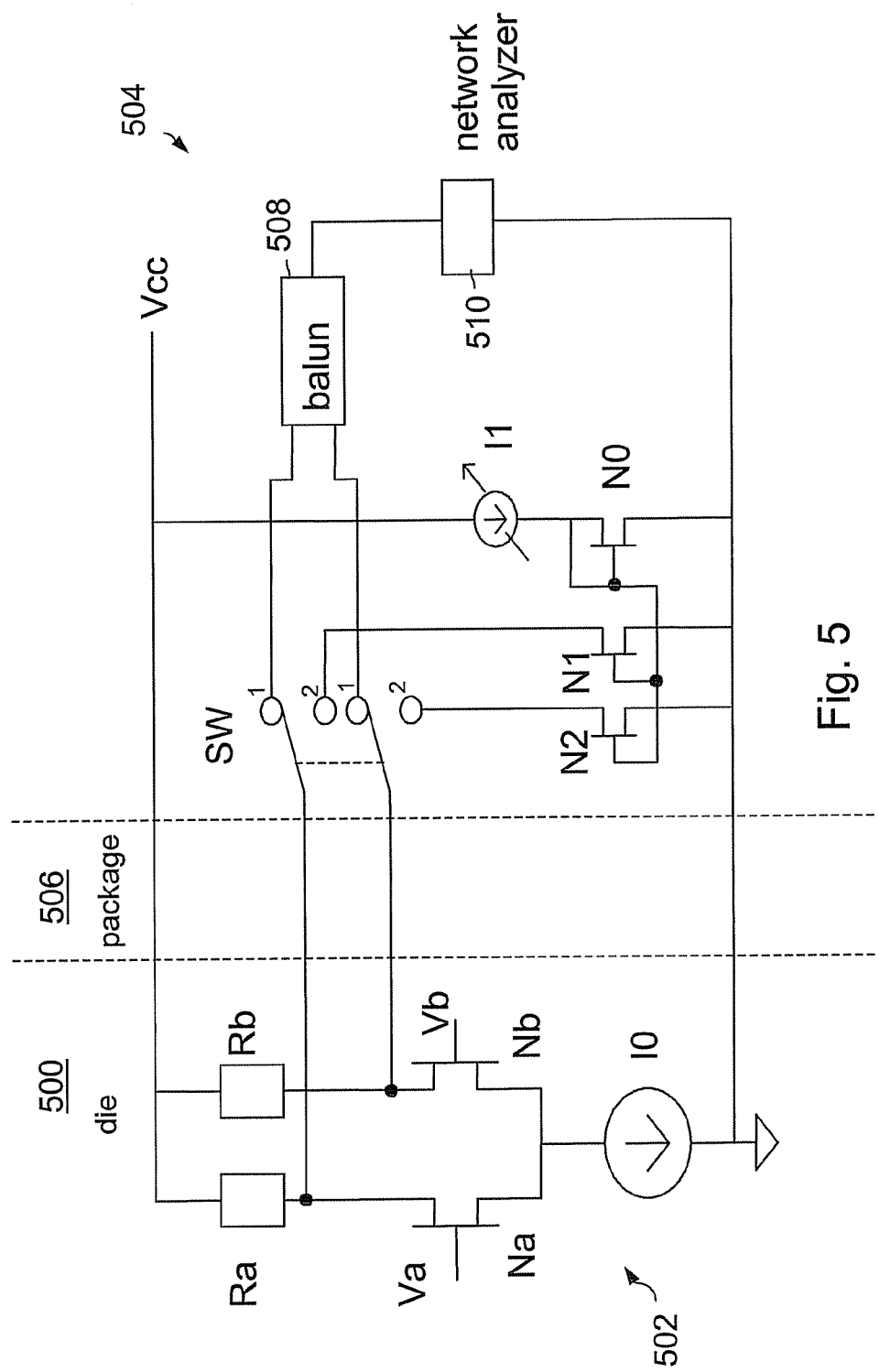
FIG. 5 is a schematic diagram of an apparatus and method for network parameter matching in transmission circuits using TaN based resistors, in accordance with still another alternative embodiment of the invention.

Finally, FIG. 5 is a schematic diagram of an apparatus and method for network parameter matching in transmission circuits using TaN based resistors, in accordance with still another embodiment of the invention. In very high-speed applications (e.g., millimeter wave applications), the tuning of impedance matching resistors to an exact value of Z0 may not be the optimal setting due the parasitic parameters of the package. In this instance, it becomes desirable to tune the resistances of Ra and Rb on-line (including the package parasitic parameters) and measure the S11 parameter of Ra and Rb (as a 2-port pair) at the same time. The tuning may be implemented during module testing.

As shown in FIG. 5, a differential driver circuit 502 is formed on chip 500 and a tester 504 is configured for S11 parameter testing, including the parasitic characteristics of packaging 506. The tester 504 includes a wide-bandwidth, double pole switch SW that selectively couples one side of resistors Ra, Rb to a balance-to-unbalance converter (balun) 508 for single-ended output analysis of the two port input (when SW is configured in position 1. A network analyzer 510 measures the S11 parameter of Ra, Rb in this mode. For tuning purposes, position 2 of double pole switch SW couples Ra and Rb to NFETs N1 and N2, respectively. N0, N1 and N2 form a current mirror, which generates a voltage across (and thus tunes) Ra and Rb using the same current. In summary, when SW is set to position 1, S11 is measured. When SW is set to position 22, Ra and Rb are tuned. This sequence may be repeated as needed to attain a desired value of S11, such as −10 dB, for example.

As thus will be appreciated, the use of voltage-programmable TaN resistors as impedance matching devices is advantageous over existing approaches, such as finger resistor networks. Because, no on-line calibration of the resistors is needed, signal glitches can be avoided in the event resistance values are altered. Moreover, the TaN resistors provide a high degree of accuracy for impedance matching with low parasitic capacitance, thereby resulting in better circuit performance.

From a manufacturing standpoint, elimination of conventional (BR & OP) resistors from the front-end-of-line (FEOL) regime so that the FEOL can provide extra processing leverage/budget for fine tuning certain other, "more critical" parameters for active devices. In contrast, a back-end-of-line (BEOL) TaN resistor has a very low TCR (temperature coefficient of resistance), and resistance is very stable under usage/bias temperature conditions. Because the resistances of TaN resistors are tunable before final product shipment, any resistance variations associated therewith would due to process conditions, and such variations may be minimized by post-process tuning. Where a TaN resistor is used for impedance matching, the resistance can be tuned to a very accurate and stable value with very low parasitic capacitance.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for trimming impedance matching devices in high-speed circuits, the method comprising:
   determining an electrical parameter associated with a first tantalum nitride (TaN) resistor used as an impedance matching device in the circuit under test;
   comparing the determined electrical parameter associated with the first TaN resistor to a desired design value of the electrical parameter;
   altering the resistance value of the first TaN resistor by application of a trimming voltage thereto, wherein the trimming voltage is based on a voltage-resistance characteristic curve of the first TaN resistor;
   determining whether the altered resistance value of the first TaN resistor causes the electrical parameter to equal the desired design value thereof; and
   repeating the altering of the resistance value of the first TaN resistor by application of a trimming voltage until the electrical parameter equals the desired design value thereof.

2. The method of claim 1, further comprising trimming the value of a second TaN resistor included within the circuit in the same manner as the first TaN resistor, wherein the first and second TaN resistors are included in a differential driver portion of the circuit.

3. The method of claim 2, wherein:

the electrical parameter of the TaN resistors is the impedance thereof;

the impedance of the first and second TaN resistors are individually measured through an ohmmeter included within an external testing device with respect to a chip on which the circuit under test is formed, and while the individual TaN resistor being measured is electrically isolated from a voltage supply bus of the circuit under test; and the trimming voltage used to individually alter the resistance value of the first and second TaN resistors is applied through a variable voltage source included within the external testing device.

4. The method of claim 3, wherein the circuit under test further comprises a plurality of PFET switching devices configured to selectively couple and decouple the first and second TaN resistors to and from the voltage supply bus and a pin accessible by the external testing device.

5. The method of claim 2, wherein:

the electrical parameter of the TaN resistors is the impedance thereof;

the impedance of the first and second TaN resistors are individually determined through a voltage measurement thereacross by a voltmeter included within an external testing device with respect to a chip on which the circuit under test is formed, and in combination with a variable current source included within the testing device, the variable current source configured to supply current individually through the first and second TaN resistors; and wherein the variable current source is also configured to generate a level of current sufficient to correspond to the trimming voltage used to individually alter the resistance value of the first and second TaN resistors.

6. The method of claim 2, wherein:

the electrical parameter of the TaN resistors is an S11 network parameter associated with the first and second TaN resistors as a 2-port pair;

the S11 network parameter is determined through selective connection of the first and second TaN resistors to a balun device coupled to a network analyzer, the balun device and network analyzer included within an external testing device with respect to a chip on which the circuit under test is formed, and in combination with a variable current source included within the testing device, the variable current source configured to supply current individually through the first and second TaN resistors; and wherein the variable current source is also configured to generate a level of current sufficient to correspond to the trimming voltage used to alter the resistance value of the first and second TaN resistors.

7. The method of claim 6, wherein the testing device further comprises a double pole switch configured to couple one end of the first and second TaN resistors to the balun device in a first position, and to a pair of current mirror devices in a second position, the current mirror devices configured to generate corresponding trimming voltages across the first and second TaN resistors.

8. The method of claim 2, wherein the trimming voltage used for altering the resistance of the first and second TaN resistors exceeds a designed operational voltage thereacross.

* * * * *